(12) United States Patent
Altice, Jr. et al.

(10) Patent No.: US 10,032,825 B2
(45) Date of Patent: Jul. 24, 2018

(54) IMAGE SENSOR WITH A GATED STORAGE NODE LINKED TO TRANSFER GATE

(71) Applicant: MICRON TECHNOLOGY, INC., Boise, ID (US)

(72) Inventors: Peter P. Altice, Jr., Lake Oswego, OR (US); Jeffery A. McKee, Boise, ID (US)

(73) Assignee: SAMSUNG ELECTRONICS, CO., LTD., Gyeonggi-Do (KR)

( * ) Notice: Subject to any disclaimer, the term of this patent is extended or adjusted under 35 U.S.C. 154(b) by 624 days.

(21) Appl. No.: 13/920,677

(22) Filed: Jun. 18, 2013

(65) Prior Publication Data

US 2013/0277537 A1 Oct. 24, 2013

Related U.S. Application Data

(60) Continuation of application No. 13/309,199, filed on Dec. 1, 2011, now Pat. No. 8,471,938, which is a continuation of application No. 12/232,994, filed on Sep. 26, 2008, now Pat. No. 8,081,249, which is a division of application No. 10/721,191, filed on Nov. 26, 2003, now Pat. No. 7,443,437.

(51) Int. Cl.
*H01L 27/148* (2006.01)
*H04N 5/363* (2011.01)
*H04N 5/3745* (2011.01)

(52) U.S. Cl.
CPC ......... *H01L 27/148* (2013.01); *H04N 5/363* (2013.01); *H04N 5/37457* (2013.01)

(58) Field of Classification Search
CPC ... H01L 27/148; H04N 5/363; H04N 5/37457
USPC ....... 250/208.1, 214.1, 214 R; 348/294-312; 257/223, 230, 232, 435
See application file for complete search history.

(56) References Cited

U.S. PATENT DOCUMENTS

| | | | |
|---|---|---|---|
| 5,619,049 A * | 4/1997 | Kim | H01L 27/14887 257/223 |
| 6,043,478 A | 3/2000 | Wang | |
| 6,107,655 A | 8/2000 | Guidash | |
| 6,317,154 B2 | 11/2001 | Beiley | |
| 6,352,869 B1 | 3/2002 | Guidash | |
| 6,486,913 B1 | 11/2002 | Afghahi et al. | |
| 6,522,357 B2 | 2/2003 | Beiley et al. | |
| 6,635,857 B1 * | 10/2003 | Kindt | H04N 5/3575 250/208.1 |

(Continued)

OTHER PUBLICATIONS

Roger T. Howe and Charles G. Sodini 1997 lecture notes ("Class Notes"):http://www.prenhall.com/howe3/microelectronics/index.html; Lecture 9, The MOS Capacitor: http://www.prenhall.com/howe3/microelectronics/pdf_folder/lectures/mwf/lecture9.fm5.pdf.

*Primary Examiner* — Georgia Y Epps
*Assistant Examiner* — Don Williams
(74) *Attorney, Agent, or Firm* — Harness, Dickey & Pierce, PLC

(57) ABSTRACT

A CMOS imaging system with increased charge storage of pixels yet decreased physical size, kTC noise and active area. A storage node is connected to the transfer gate and provides a storage node for a pixel, allowing for kTC noise reduction prior to readout. The pixel may be operated with the shutter gate on during the integration period to increase the amount of time for charge storage by a pixel.

19 Claims, 12 Drawing Sheets

(56) References Cited

U.S. PATENT DOCUMENTS

| | | |
|---|---|---|
| 6,657,665 B1 | 12/2003 | Guidash |
| 6,693,670 B1 | 2/2004 | Stark |
| 6,731,335 B1 | 5/2004 | Kim et al. |
| 6,750,912 B1 | 6/2004 | Tennant et al. |
| 6,867,806 B1 | 3/2005 | Lee et al. |
| 7,053,947 B2 | 5/2006 | Sohn |
| 7,064,362 B2 | 6/2006 | Roy |
| 7,238,926 B2 | 7/2007 | Guidash et al. |
| 7,244,918 B2 | 7/2007 | McKee et al. |
| 7,332,786 B2 | 2/2008 | Altice et al. |
| 7,443,437 B2 | 10/2008 | Altice et al. |
| 7,542,085 B2 | 6/2009 | Altice et al. |
| 2001/0006402 A1 | 7/2001 | Hosier et al. |
| 2001/0007471 A1 | 7/2001 | Beiley |
| 2002/0018131 A1 | 2/2002 | Kochi |
| 2004/0041930 A1 | 3/2004 | Chao et al. |
| 2004/0041932 A1 | 3/2004 | Chao et al. |
| 2005/0012836 A1 | 1/2005 | Guidash |
| 2005/0040393 A1* | 2/2005 | Hong ............... H01L 27/14603 257/40 |
| 2005/0110093 A1 | 5/2005 | Altice et al. |
| 2005/0248675 A1 | 11/2005 | Hashimoto et al. |
| 2007/0018267 A1 | 1/2007 | Altice et al. |
| 2007/0285545 A1 | 12/2007 | Hsieh |

* cited by examiner

IMAGE SENSOR WITH A GATED STORAGE NODE LINKED TO TRANSFER GATE

CROSS-REFERENCE TO RELATED APPLICATIONS

This application is a continuation of U.S. patent application Ser. No. 13/309,199, filed on Dec. 1, 2011, now U.S. Pat. No. 8,471,938, granted Jun. 25, 2013, which is a continuation of U.S. patent application Ser. No. 12/232,994, filed on Sep. 26, 2008, now U.S. Pat. No. 8,081,249, granted Dec. 20, 2011, which is a divisional of U.S. patent application Ser. No. 10/721,191, filed on Nov. 26, 2003, now U.S. Pat. No. 7,443,437, granted Oct. 28, 2008, the subject matter of each of which is incorporated in its entirety by reference herein.

FIELD OF THE INVENTION

The invention relates generally to improving the charge storage capacity of an imager pixel.

BACKGROUND OF THE INVENTION

An imager, for example, a CMOS imager includes a focal plane array of pixel cells; each cell includes a photosensor, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion node. The pixel cell may also include a transistor for transferring charge from the photosensor to the floating diffusion node. The pixel cell also typically includes a transistor to reset the floating diffusion node.

FIG. 1 illustrates a block diagram of a CMOS imager device 908 having a pixel array 200 with each pixel cell being constructed as described above. Pixel array 200 comprises a plurality of pixels arranged in a predetermined number of columns and rows. The pixels of each row in array 200 are all turned on at the same time by a row select line, and the pixels of each column are selectively output by respective column select lines. A plurality of row and column lines are provided for the entire array 200. The row lines are selectively activated in sequence by the row driver 210 in response to row address decoder 220 and the column select lines are selectively activated in sequence for each row activated by the column driver 260 in response to column address decoder 270. Thus, a row and column address is provided for each pixel. The CMOS imager 908 is operated by the control circuit 250, which controls address decoders 220, 270 for selecting the appropriate row and column lines for pixel readout, and row and column driver circuitry 210, 260, which apply driving voltage to the drive transistors of the selected row and column lines. The pixel output signals typically include a pixel reset signal, $V_{rst}$ taken off the floating diffusion node when it is reset and a pixel image signal, $V_{sig}$, which is taken off the floating diffusion node after charges generated by an image are transferred to it. The $V_{rst}$ and $V_{sig}$ signals are read by a sample and hold circuit 265 and are subtracted by a differential amplifier 267 that produces a signal $V_{rst}$-$V_{sig}$ for each pixel, which represents the amount of light impinging on the pixels. This difference signal is digitized by an analog to digital converter 275. The digitized pixel signals are then fed to an image processor 280 to form a digital image. The digitizing and image processing can be performed on or off the chip containing the pixel array.

Imager pixels, including CMOS imager pixels typically have low signal to noise ratios and narrow dynamic range because of their inability to fully collect, transfer and store the electric charge collected by the photosensitive area of the photosensor. In addition, the pixels are subject to kTC noise, which is a thermal dependent noise generated during the reset of the pixel. The kTC noise refers to the random variation of voltage during the reset of a diffusion area or a storage capacitor.

Since the size of the pixel electrical signal is very small, due to the collection of photons in the photo array, the signal to noise ratio and dynamic range of the pixel should be as high as possible. In addition, the use of additional gates to increase the functional operations of the pixel (i.e., electronic shuttering) increases the size of the pixel or reduces the fill factor of the pixel. There is needed, therefore, an improved pixel cell for use in an imager having decreased noise and size, and a larger charge storage capacity.

BRIEF SUMMARY OF THE INVENTION

The present invention provides increased storage capacity for a pixel cell of an imager. In a first exemplary embodiment, each pixel cell has a global electronic shutter that transfers the image electrons from a photosensor to a gated storage node before the electrons are further transferred to a floating diffusion node of the pixel cell.

The storage node in the first exemplary embodiment is formed by an additional depletion area between the photosensor and floating diffusion node. This area is separated from the photodiode and floating diffusion node by gates: (1) a storage gate that covers both a barrier (from opposingly doped silicon) and the storage node and (2) a transfer gate that separates the storage node from the floating diffusion node. The charge is stored beneath the storage gate in the depleted area. By including an additional storage node in the pixel, the floating diffusion node can be reset and readout prior to charge transference to the floating diffusion node, which allows for double sampling and a reduction of kTC noise. The amount of charge the pixel can store also increases since the gated storage node has a greater charge storage capacity than the floating diffusion node.

In a second embodiment, two pixels having respective gated storage nodes share a floating diffusion node and reset and readout circuitry. In addition to having an increased storage capacity, the charge generating area of the pixels is increased because the area normally devoted to a second floating diffusion node, and reset and readout circuitry is now shared by the two pixels. Since two pixels share a floating diffusion node and reset and readout circuitry, a shutter clock for the first pixel is clocked onto the floating diffusion node to correctly readout and output an image. Once the readout and output of the first pixel occurs, the floating diffusion node is reset and the shutter clock for the second pixel is clocked onto the same floating diffusion node for output in the same fashion as the first pixel.

In a third embodiment, four pixels using the gated storage node described above share a floating diffusion node and reset and readout circuitry. This further increases the charge generating area of the pixels by using the area formerly designated for use by three floating diffusion nodes and associated reset and readout circuits to increase the charge generating area of each pixel. Since four pixels share a floating diffusion node, and reset and readout circuitry, the two pixels sharing a column or row are output during the same clock cycle. This occurs by clocking the first pixel onto the floating diffusion node and resetting the floating diffusion node on a first half clock cycle. The second pixel is subsequently clocked onto the floating diffusion node during a second half clock cycle for readout and output. This operation is repeated for output of the third and fourth pixel, each of which is output on a half cycle of the second clock cycle.

In addition, a procedure that may be utilized to further increase the performance of the CMOS imager embodiments is operating the CMOS pixel with the shutter gate of the imager in an open position during a charge integration period. Having the gate open during the integration period allows additional time for a charge to be collected and transferred to the gated storage node. As a result, the size of the shutter gates can be reduced and the pixel has a larger charge storage.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention.

It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photo conversion device or photosensor and transistors for processing an electrical signal from electromagnetic radiation sensed by the photo conversion device. The pixels discussed herein are illustrated and described as inventive modifications to five transistor (5T) pixel circuits for the sake of example only. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 2:
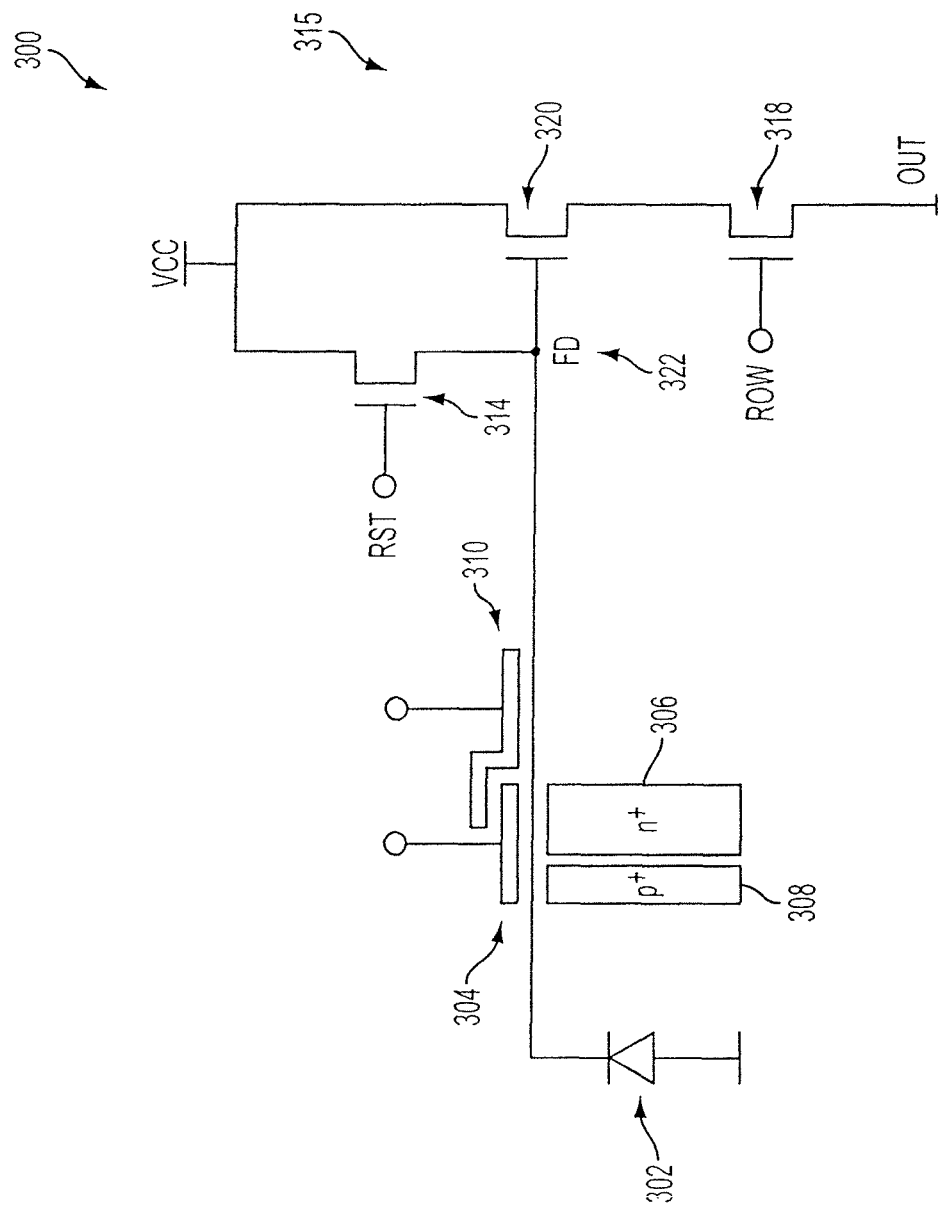
FIG. 2 is a schematic circuit diagram of an exemplary five transistor pixel according to a first embodiment of the invention.

FIG. 2 illustrates an exemplary circuit 300 for a pixel of a CMOS imager according to a first exemplary embodiment of the invention. The pixel includes a photosensor, e.g. a photodiode 302, shutter gate transistor 304, storage node 306, barrier region 308, transfer gate transistor 310, floating diffusion node 322, and a reset and readout circuit 315 including reset transistor 314, source follower transistor 320 and row select transistor 318.

Figure 9:
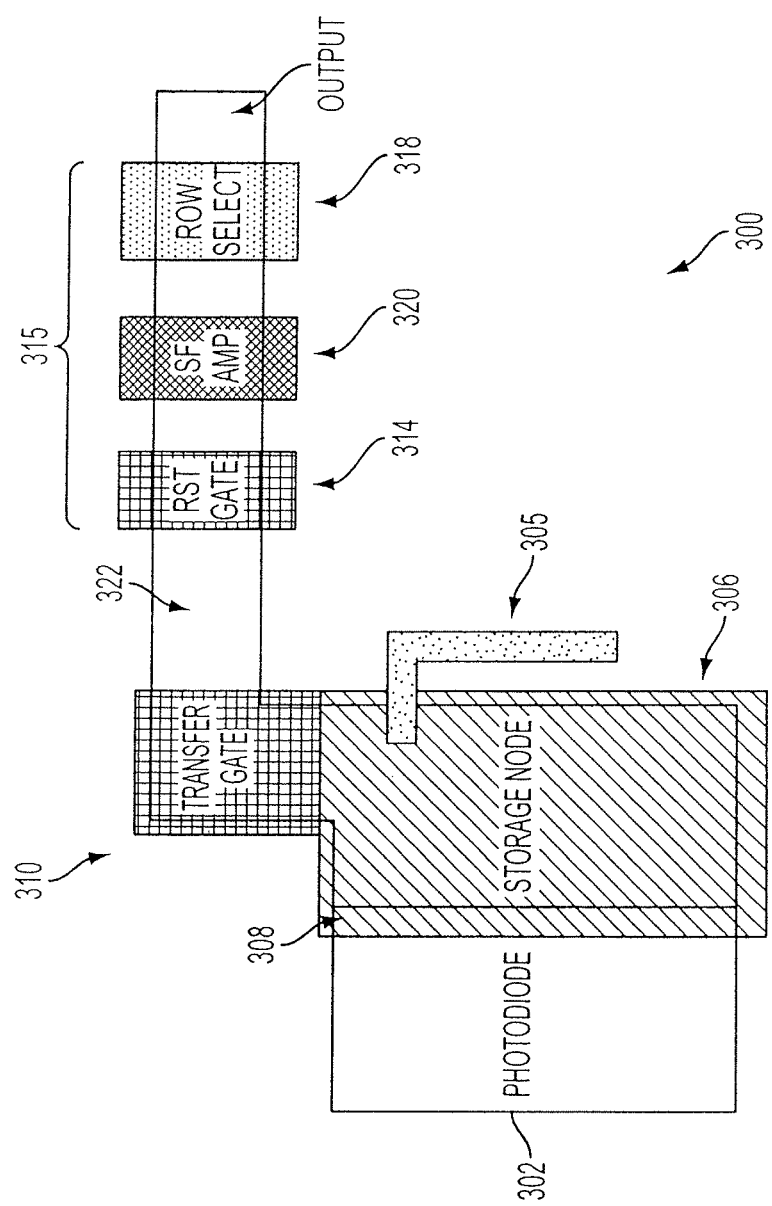
FIG. 9 is a top down diagram of an exemplary pixel circuit according to a first embodiment of the invention.

FIG. 9 is a top down illustration of circuit 300. The circuit 300 includes the photodiode 302, barrier region 308, storage node 306, shutter gate line 305, floating diffusion node 322 and reset and readout circuit 315 described above with reference to FIG. 2. Shutter gate transistor 304 (not shown) is connected to storage node 306 via the global shutter line 305. The shutter gate 304 is also connected to the photodiode 302 (as shown in FIG. 2). Storage node 306 is connected to transfer gate transistor 310, which is coupled to the readout circuit 315 via floating diffusion node 322. Barrier layer 308 is, for example, a boron layer that is implanted between photodiode 302 and storage node 306 to control charge transference from photodiode 302 to storage node 306. Tying barrier region 308 to shutter gate transistor 304 decreases barrier region 308 and allows charge transfer from photodiode 302 to storage node 306 when shutter transistor 304 is driven high.

The pixel 300 illustrated in FIGS. 2 and 9 is formed on a semiconductor substrate and utilizes intermediate storage node 306 formed within the substrate for storing charge from photodiode 302. As photodiode 302 generates signal charge in response to incident light, the charge is transferred via the shutter gate transistor 304 to storage node 306.

Figure 5:
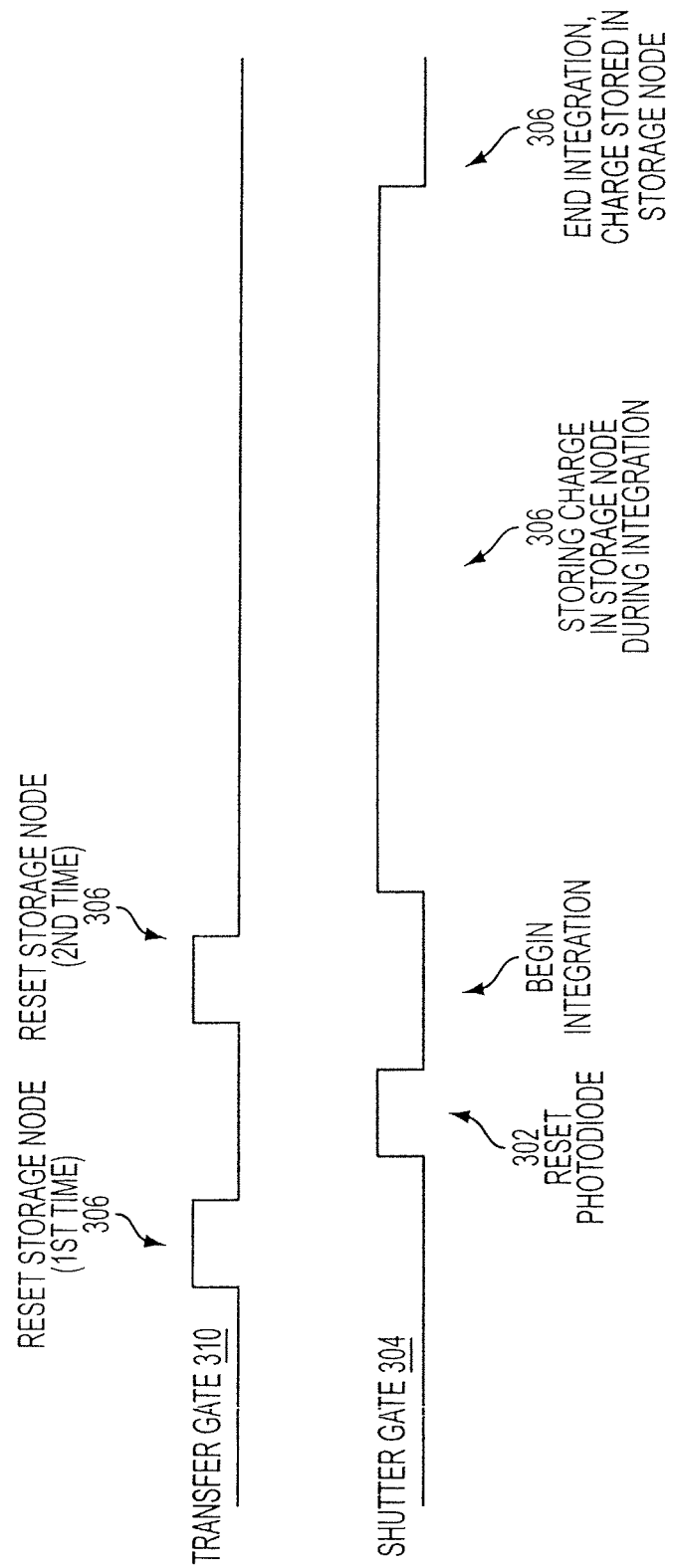
FIG. 5 is a timing diagram of charge storage integration according to a first embodiment of the invention.

The timing of charge storage in storage node 306 occurs by first resetting storage node 306, resetting photodiode 302, and resetting storage node 306 a second time, which is illustrated in FIG. 5. Alternatively, the pixel could be processed to have a potential under the shutter gate transistor 304 lower than a potential under the transfer gate transistor 310 when both gates are on, such that storage node 306 could be reset by holding the transfer gate transistor 310 high (as depicted by the dotted line) and cycling the shutter gate transistor 304. In either case, the gate of reset transistor 314 should be high during reset of storage node 306 to ensure that the floating diffusion node 322 is maintained at a high potential.

Subsequent to the second reset of storage node 306, charge received from photodiode 302 is transferred to storage node 306 during a charge integration period; however, charge received from photodiode 302 could also be transferred to storage node 306 after the charge integration period. The storage node 306 permits a greater amount of charge to be stored than would be stored solely using the floating diffusion node 322. Consequently, the capacitive storage of the pixel is increased.

In addition, because the charge transferred from photodiode 302 is initially stored in a storage node 306, the floating diffusion node 322 can be reset during the same frame the image is being captured. This permits a correlated double sampling operation that results in reduced kTC noise and a sharper image. The charge residing at storage node 306 is subsequently transferred to the floating diffusion node 322 by the transfer gate 310, where the charge is applied to the gate of source follower transistor 320 for readout through row select transistor 318.

Figure 6:
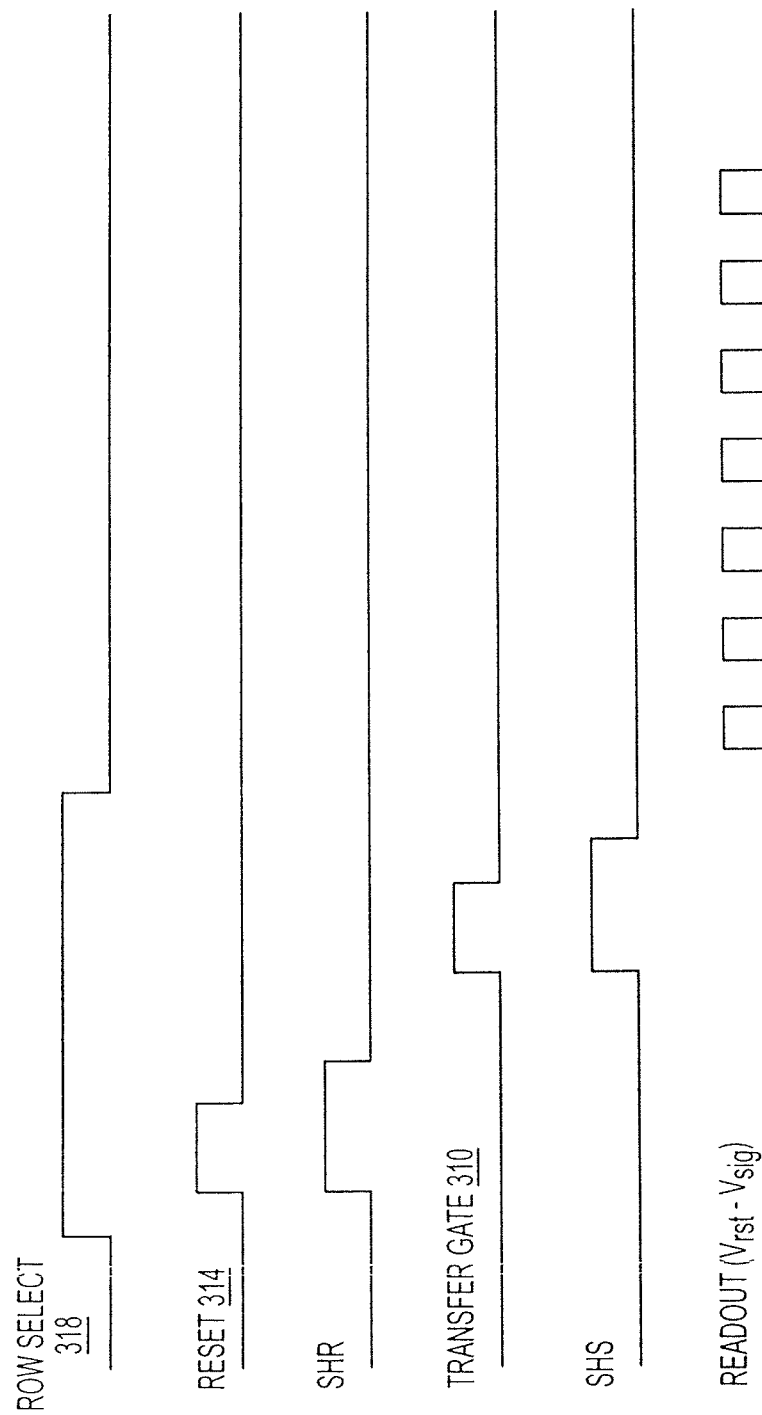
FIG. 6 is a timing diagram of charge readout according to a first embodiment of the invention.

FIG. 6 illustrates an output timing diagram for circuit 300 (FIG. 2) during pixel readout. The row select transistor 318 is turned on and the reset transistor 314 is briefly turned on, thereby resetting floating diffusion node 322 to a predetermined voltage. The charge on the floating diffusion node 322 is applied to the gate of source follower transistor 320, which is translated to a voltage and subsequently sampled by sample and hold circuitry, where SHR illustrates the time when the reset voltage is stored on the sample and hold capacitor.

Charge stored in storage node 306 is then transferred to floating diffusion node 322 by turning on transfer gate transistor 310. The charge on the floating diffusion node 322 is applied to the gate of source follower transistor 320, which is translated to a voltage and subsequently sampled by sample and hold circuitry for readout, where SHS illustrates the time when the signal voltage is stored on the sample and hold capacitor.

The FIG. 2 circuit 300 operates using a global electronic shutter, for example, shutter gate 304, which allows an input signal, i.e., incident light, to be applied simultaneously across an imager array so each row of pixels in the array acquires the charge from respective photodiodes at the same time. When acquiring an image, the integration cycle for each row is the same. Once the image has been acquired, the charge from each pixel is transferred to a storage node for readout. The readout occurs row-by-row; however, the input for each row's image is captured simultaneously. Thus, the actual time in which signal acquisition begins and ends is different from row to row. Consequently, each row in the array is integrated separately, but the time that each row acquires a signal is the same.

Figure 3:
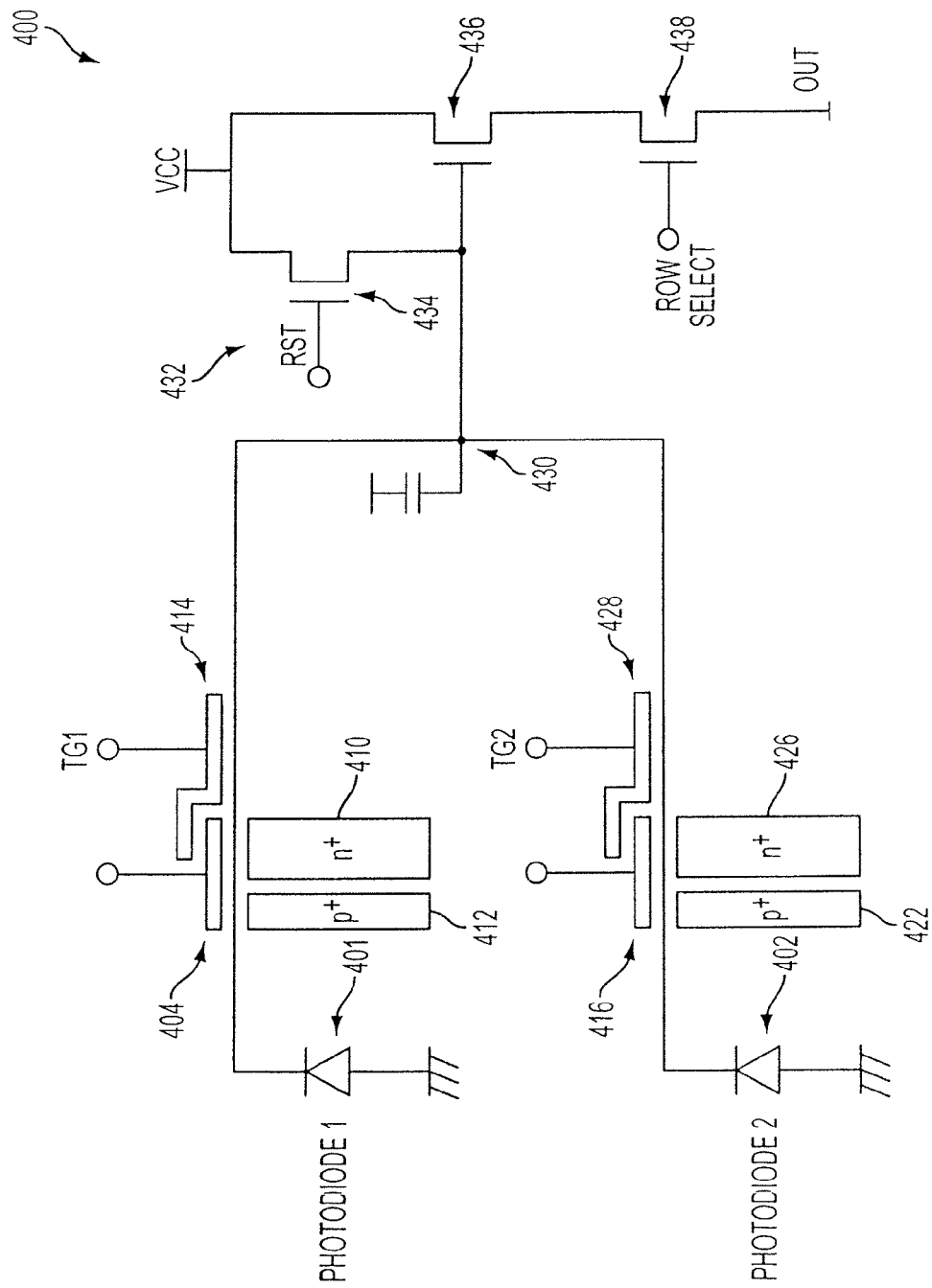
FIG. 3 is a schematic circuit diagram of an exemplary circuit in which two pixels share a floating diffusion node and reset and readout circuitry according to a second embodiment of the invention.

The FIG. 2 circuit 300 employs one floating diffusion node 322 per pixel. FIG. 3 illustrates a second exemplary embodiment of the invention in which two pixels share a floating diffusion node 430 and reset and readout circuitry 432. Circuitry 432 includes a reset transistor 434, source follower transistor 436 and row select transistor 438. The illustrated circuit 400 includes two pixels, each including respective photodiodes 401, 402, shutter gate transistors 404, 416, storage nodes 410, 426, barrier regions 412, 422, and transfer gate transistors 414, 428. A single output line out is provided for the two pixels.

Figure 10:
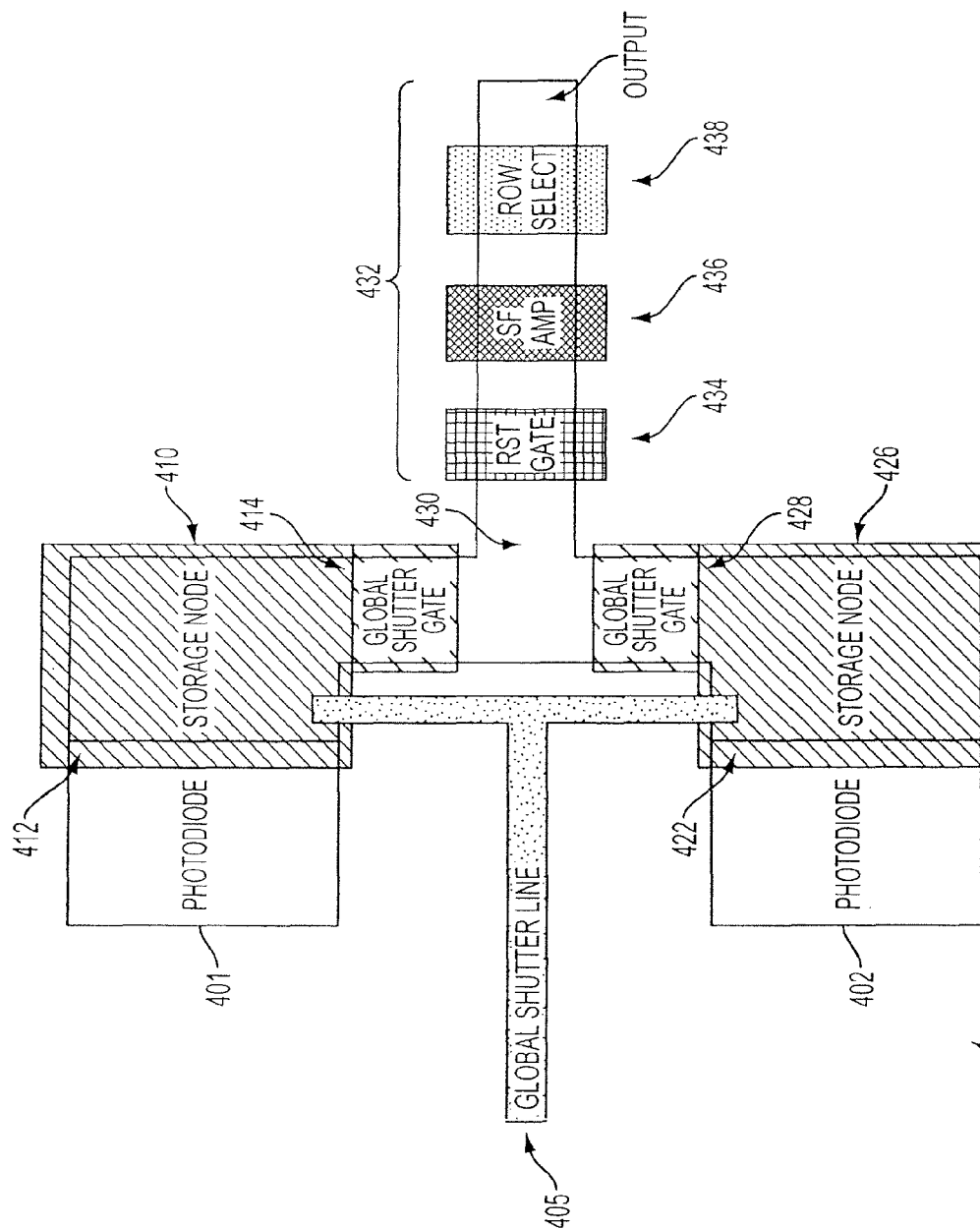
FIG. 10 is a top down diagram of an exemplary pixel circuit according to a second embodiment of the invention.

FIG. 10 is a top down illustration of circuit 400. The circuit 400 includes the photodiodes 401, 402, barrier regions 412, 422, storage nodes 410, 426, shutter gate line 405, floating diffusion node 430 and reset and readout circuit 432 described above with reference to FIG. 3. Shutter gate transistor 404 (not shown) is connected to storage node 410 via shutter line 405. The shutter gate 404 is also connected to the photodiode 401 (as shown in FIG. 3). Storage node 410 is connected to transfer gate transistor 414 during charge transference to the circuit 432 for a first charge readout. Shutter gate transistor 416 (not shown in FIG. 10) is connected to storage node 426 via shutter line 405. The shutter gate 416 is also connected to the photodiode 402 (as shown in FIG. 3). Storage node 426 is connected to transfer gate transistor 428 and, during charge transference, and readout to the same floating diffusion node 430 and reset and readout circuit 432 used by the first pixel.

Because multiple pixels are being readout by the same circuit 432 to display an image, pixel timing is set to allow readout of each pixel based on its predetermined position in the imager array. When the two pixels sharing circuit 432 reside in the same row or column, two transfer gates 414, 428 are utilized to clock the respective pixel signals on to the floating diffusion node 430 at the required timing. For example, the transfer gate 414 of the first pixel is turned on, transferring the charge residing in the storage node 410 to the floating diffusion node 430. This charge is then readout by turning the row select transistor 438 on. Once the row select transistor 438 and source follower transistor 436 outputs the charge, the floating diffusion node 430 is reset by turning the reset transistor 434 on. Once the floating diffusion node 430 is reset, the charge from the second pixel can be readout using the same technique. As a result, the row select transistor 438 would be on for both transfers in order to readout both pixels within in a cycle.

Figure 7:
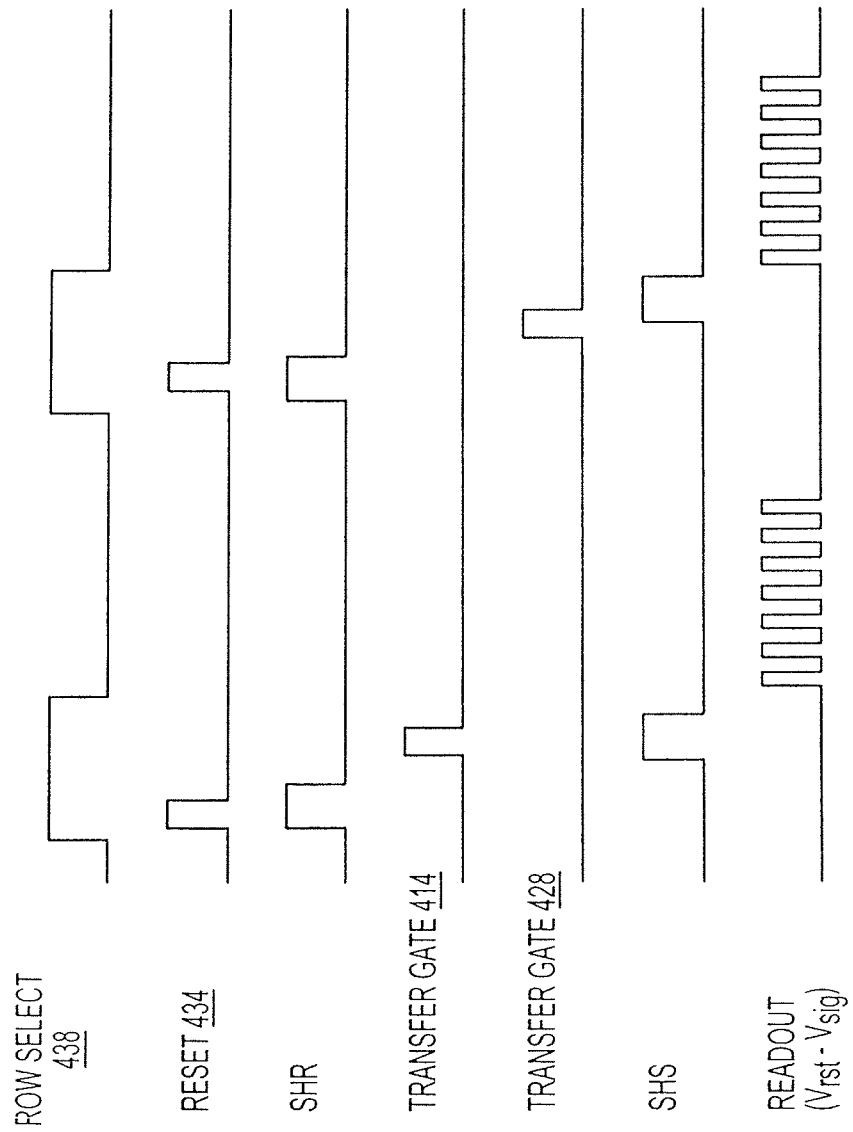
FIG. 7 is a timing diagram of charge readout according to a second embodiment of the invention.

FIG. 7 illustrates the output timing of circuit 400 (FIG. 3) during pixel readout. The row select transistor 438 is pulsed on. Reset transistor 434 is briefly turned on, thereby resetting floating diffusion node 430 to a predetermined voltage. The charge on the floating diffusion node 430 is applied to the gate of source follower transistor 436, which is translated to a voltage and subsequently sampled by sample and hold circuitry, where SHR illustrates the time when the reset voltage is stored on the sample and hold capacitor.

Charge stored in storage node 410 is then transferred to floating diffusion node 430 by turning transfer gate transistor 414 on. The charge on the floating diffusion node 430 is applied to the gate of source follower transistor 436, which is translated to a voltage and subsequently sampled by sample and hold circuitry, where SHS illustrates the time when the signal voltage is stored on the sample and hold capacitor. Photodiode 401 is subsequently reset.

The readout technique is then repeated to readout a charge accumulated by the second pixel, and results in charge transference from storage node 426 through transfer gate transistor 428 and onto the same floating diffusion node 430 for readout. Readout from each respective pixel signal occurs in a single output cycle. Consequently, the readout of pixel circuit 400 uses two clock cycles.

The circuit 400 has the same benefits as circuit 300, and additionally allows for the use of a photodiode with increased charge generation area since two photodiodes 401, 402 share a floating diffusion node 430 and additional circuitry is not required to couple the signals from nodes 410, 426 to the common floating diffusion node 430.

Figure 4:
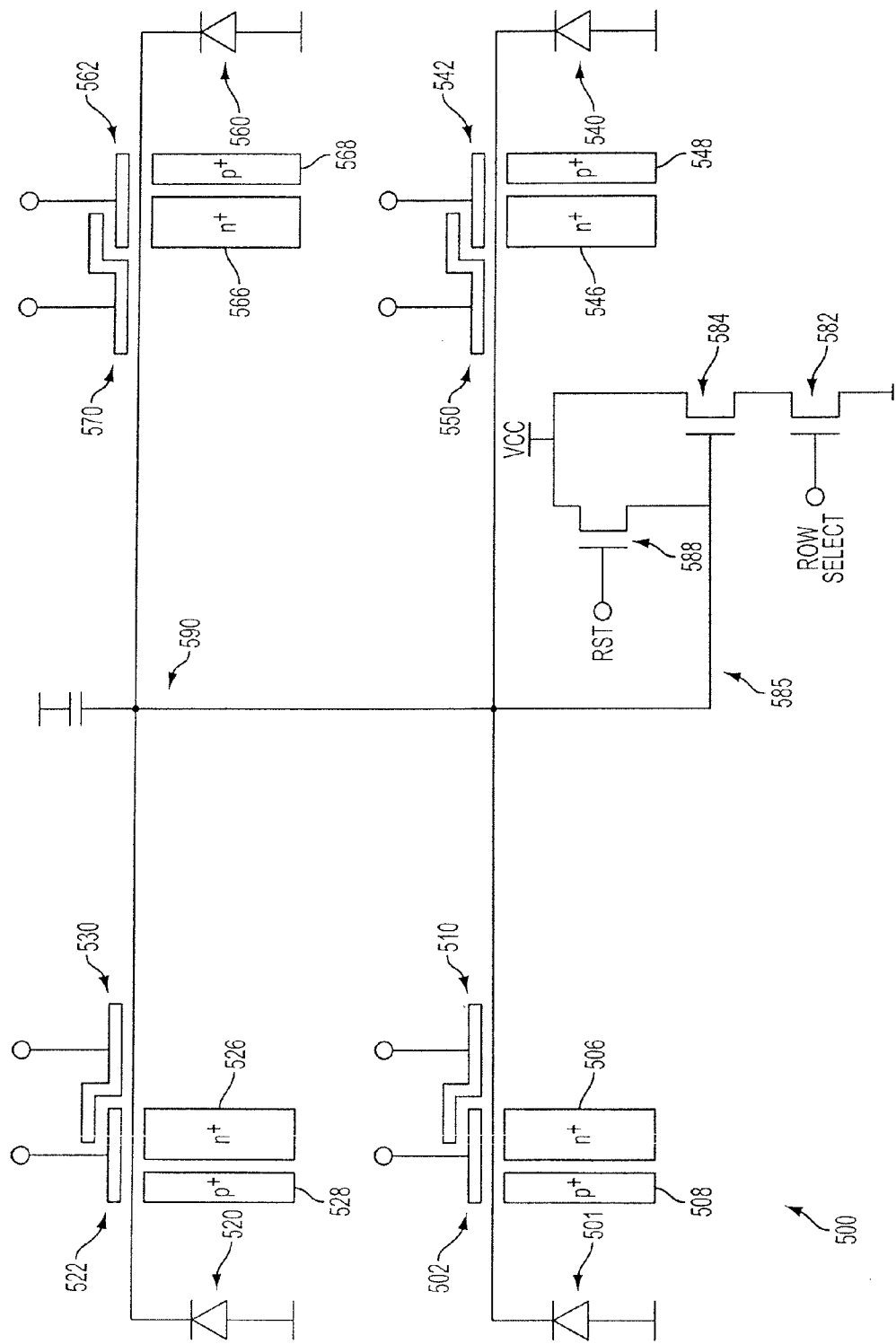
FIG. 4 is a schematic circuit diagram of an exemplary circuit in which four pixels share a floating diffusion node and reset and readout circuitry according to a third embodiment of the invention.

FIG. 4 illustrates a pixel circuit 500 of a CMOS imager according to a third exemplary embodiment of the invention. In this embodiment, four pixels share a floating diffusion node 590, and a reset and readout circuit 585. The four pixels comprise respective photodiodes 501, 520, 540, 560, shutter gate transistors 502, 522, 542, 562, storage nodes 506, 526, 546, 566, barrier regions 508, 528, 548, 568, and transfer gate transistors 510, 530, 550, 570. Reset and readout circuit 585 includes reset transistor 588, source follower transistor 584 and row select transistor 582.

Figure 11:
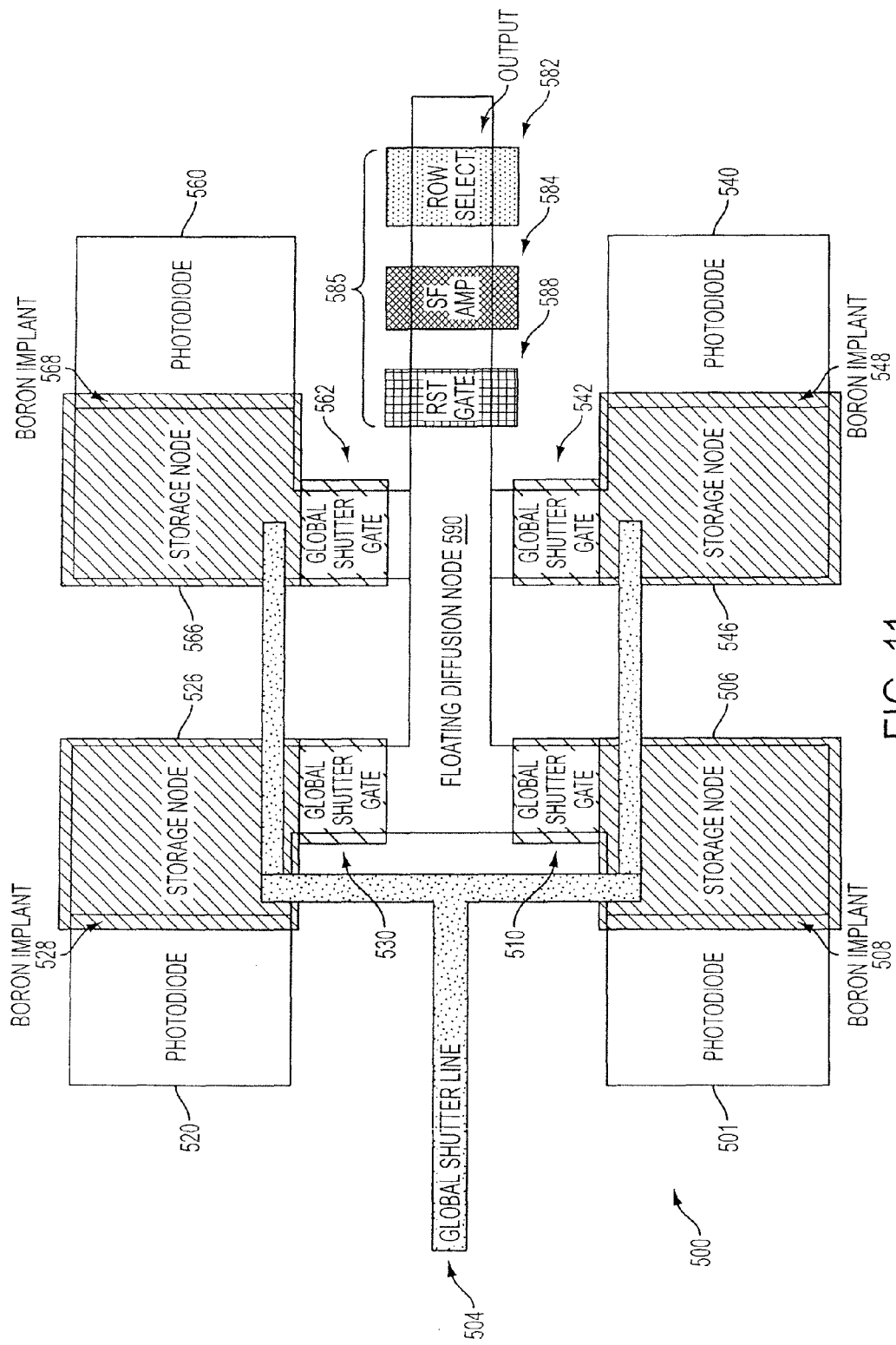
FIG. 11 is a top down diagram of an exemplary pixel circuit according to a third embodiment of the invention.

FIG. 11 is a top down illustration of circuit 500. The circuit 500 includes photodiodes 501, 520, 540, 560, barrier regions 508, 528, 548, 568, storage nodes 506, 526, 546, 566, shutter line 504, floating diffusion node 590 and reset and readout circuit 585 described above with reference to FIG. 4. Shutter gate transistor 502 (not shown) is connected to storage node 506 via shutter line 504. The shutter gate transistor 502 is also connected to the photodiode 501 (as shown in FIG. 4). Storage node 506 is connected to transfer gate transistor 510 and, during charge transference, to readout circuit 585 via floating diffusion node 590 for a first charge readout. Shutter gate transistor 522 (not shown) is connected to storage node 526 via shutter line 504. The shutter gate transistor 522 is also connected to the photodiode 520 (as shown in FIG. 4). Storage node 526 is connected to transfer gate transistor 530 and, during charge transference, to the readout circuit 585 via floating diffusion node 590 during a second charge readout.

Shutter gate transistor 542 (not shown) is connected to storage node 546 via shutter line 504. The shutter gate transistor 542 is also connected to the photodiode 540 (as shown in FIG. 4). Storage node 546 is connected to transfer gate transistor 550 and, during charge transference, to the readout circuit 585 via floating diffusion node 590 during a third charge readout. Shutter gate transistor 562 (not shown) is connected to storage node 566 via shutter line 504. The shutter gate transistor 562 is also connected to the photodiode 560 (as shown in FIG. 4). Storage node 566 is connected to transfer gate transistor 570 and, during charge transference, to the readout circuit 585 via floating diffusion node 590 during a fourth charge readout.

Because four pixels are being readout by the same circuit 585, the readout process is similar to the readout of the second embodiment (FIG. 3) but altered to output twice the number of pixel signals. When the circuit 585 reads out an image using pixels that reside in the same row or column, the two of the four transfer gates (510 and 550 or 530 and 570) associated with the corresponding photosensor (501 and 540 or 520 and 560) are utilized to clock a pixel signal onto the floating diffusion node 590 at the required timing.

Figure 8:
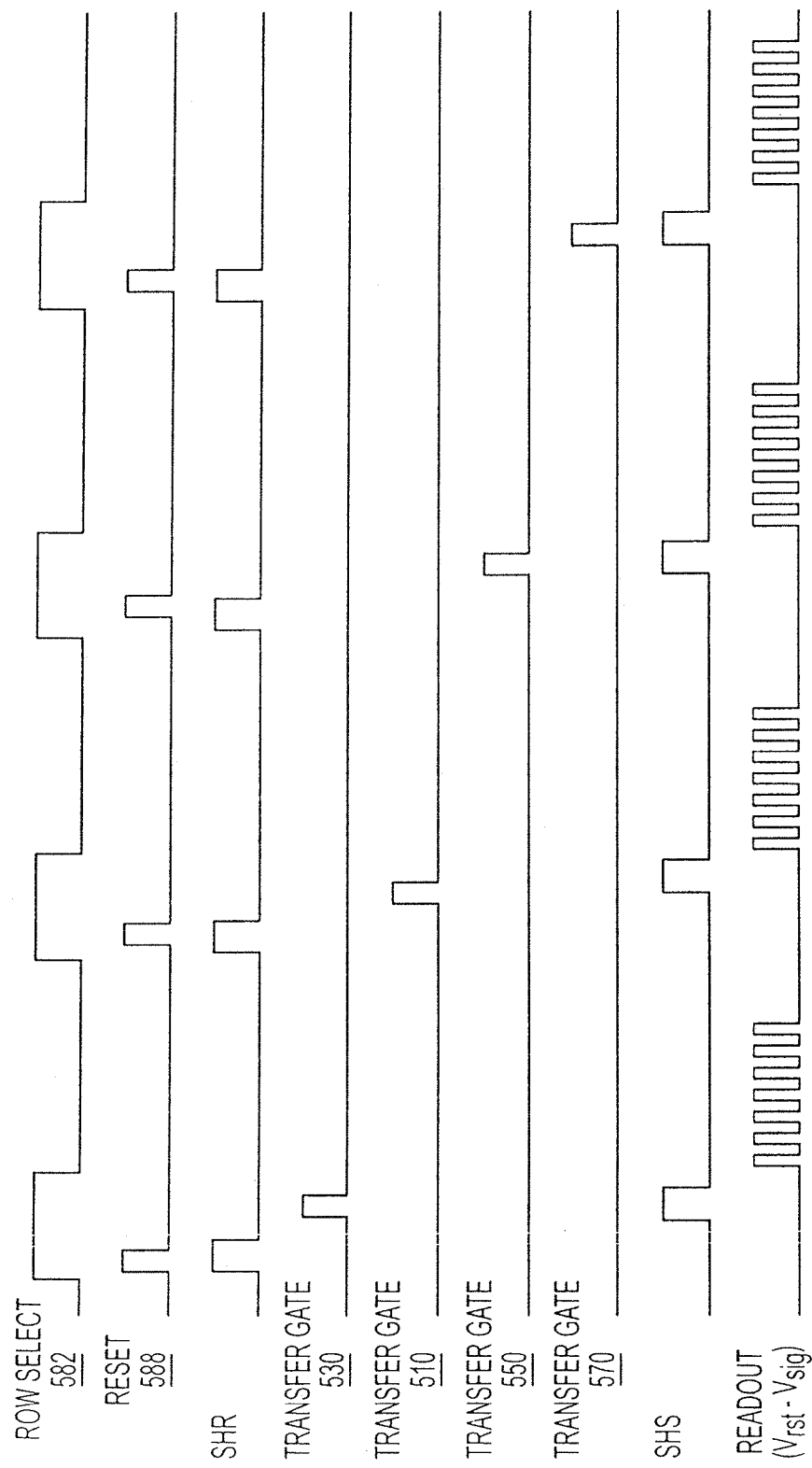
FIG. 8 is a timing diagram of charge readout according to a third embodiment of the invention.

FIG. 8 illustrates the output timing of circuit 500 (FIG. 4) during pixel readout. The row select transistor 582 is pulsed on by a row select signal. Reset transistor 588 is briefly turned on, thereby resetting floating diffusion node 590 to a predetermined voltage. The charge on the floating diffusion node 590 is applied to the gate of source follower transistor 584, which is translated to a voltage and subsequently sampled by sample and hold circuitry, where SHR illustrates the time when the reset voltage is stored on the sample and hold capacitor.

Charge stored in storage node 526 is then transferred to floating diffusion node 590 by turning transfer gate transistor 530 on. The charge on the floating diffusion node 590 is applied to the gate of source follower transistor 584, which is translated to a voltage and subsequently sampled by sample and hold circuitry, where SHS illustrates the time when the signal voltage is stored on the sample and hold capacitor, and readout ($V_{rst}$-$V_{sig}$). Photodiode 520 is subsequently reset.

The readout technique is then repeated to readout each signal from the remaining pixels of circuit 500. Charge accumulated by storage node 506 from photodiode 501 in response to its respective pixel signal is transferred from storage node 506 through transfer gate transistor 510 and onto floating diffusion node 590. Charge accumulated by storage node 546 from photodiode 540 in response to its respective pixel signal is transferred from storage node 546 through transfer gate transistor 550 and onto floating diffusion node 590. Charge accumulated by storage node 566 from photodiode 560 in response to its respective pixel signal is transferred from storage node 566 through transfer gate transistor 570 and onto floating diffusion node 590.

The readout timing of circuit 500 uses two clock cycles; however, since four pixels are being output in the two clock cycles, the readout of each pixel signal occurs on a half clock cycle allowing the readout of two pixels per output clock cycle. The row select transistor 582 is on for all four transfers.

The circuit 500 illustrated in FIG. 4 operates similarly to circuit 400 illustrated in FIG. 3; however, four adjacent photodiodes 501, 520, 540, 560 share the floating diffusion node 590 and reset and readout circuit 585. With four pixels sharing circuitry in the circuit 500, the photodiode areas can be further increased due to the reduction in the number of floating diffusion nodes, and reset transistors and readout circuits.

Figure 1:
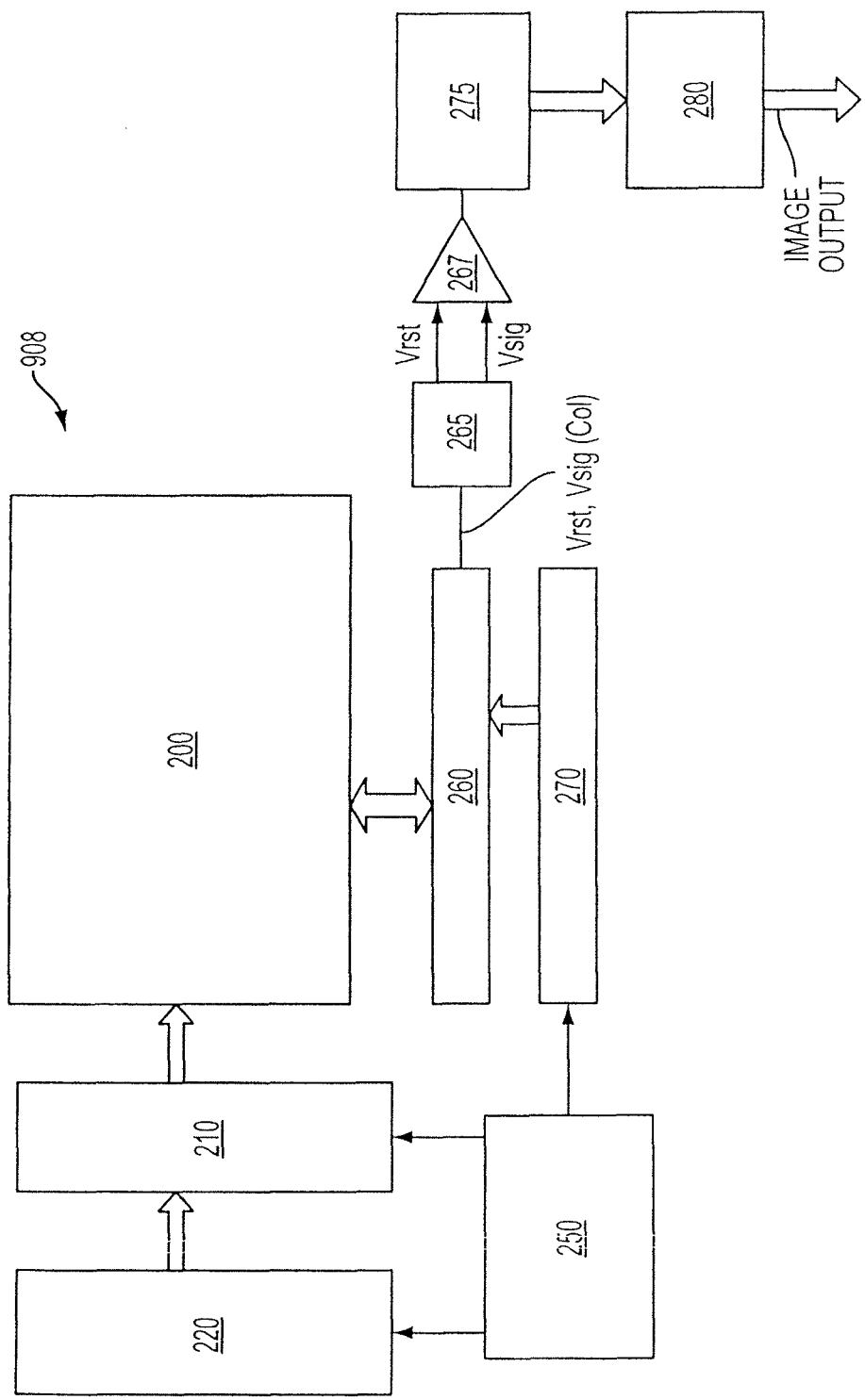
FIG. 1 is a block diagram of a conventional CMOS imager.

Charge storage capacity of each of the exemplary embodiments depicted in FIGS. 2-11 can be further increased by leaving the shutter gate on during the photodiode integration period. By allowing the shutter gate to remain on during integration, there is additional time for the photodiode to transfer the charge to the storage node. Consequently, the physical size of the shutter gate can be decreased. The pixels of the three exemplary embodiments (FIGS. 2-11) may be used to form a pixel array 200 for use in an imaging device 908 (FIG. 1).

Figure 12:
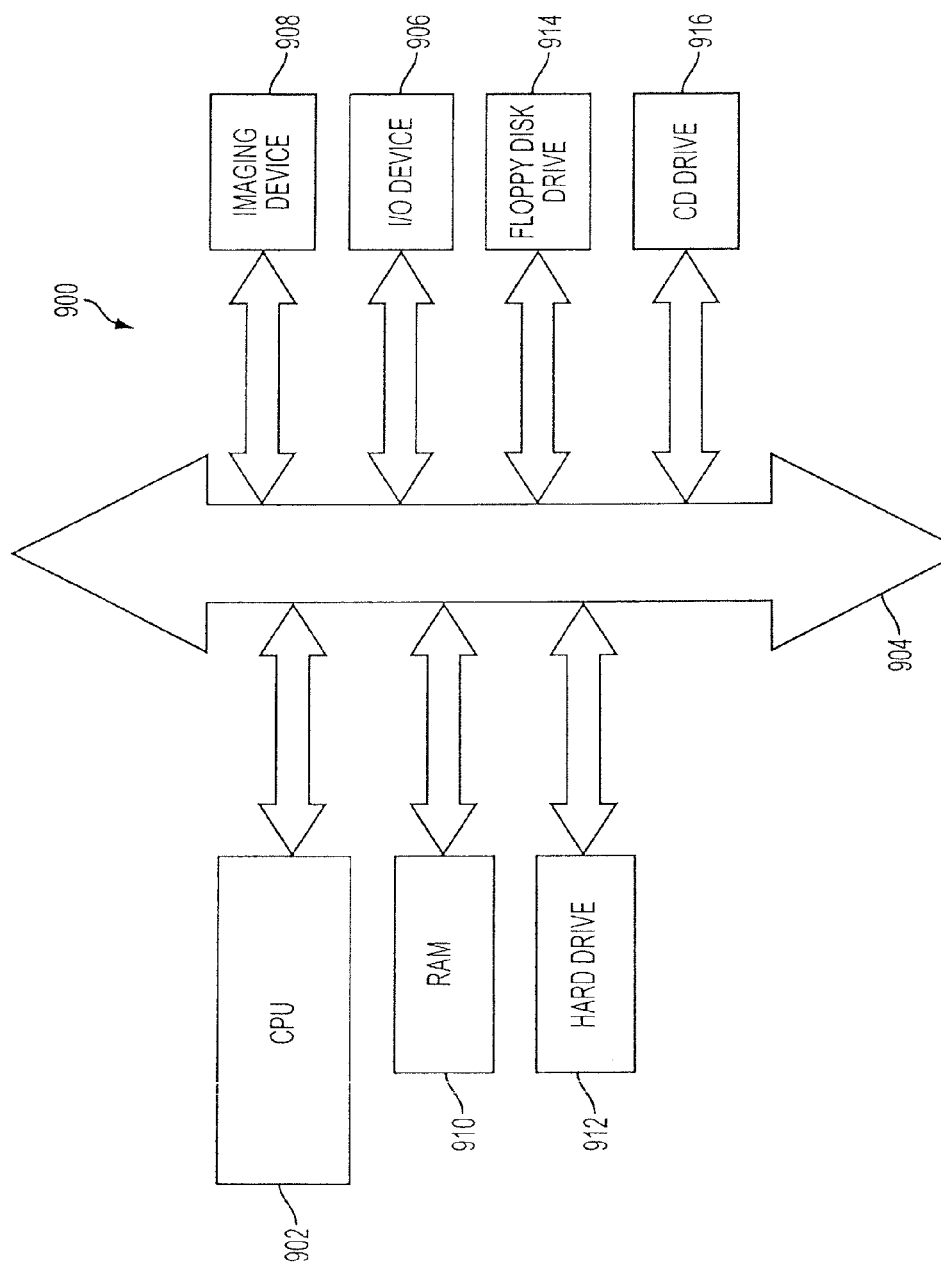
FIG. 12 is a diagram of a processing system which employs a CMOS imager having a pixel array in accordance with an embodiment of the invention.

FIG. 12 shows a processor system 900, which includes an imaging device 908 employing pixels constructed in accordance with any of the exemplary embodiments (FIGS. 2-11) of the invention. The imager device 908 may receive control or other data from system 900. System 900 includes a processor 902 having a central processing unit (CPU) that communicates with various devices over a bus 904. Some of the devices connected to the bus 904 provide communication into and out of the system 900; an input/output (I/O) device 906 and imager device 908 are such communication devices. Other devices connected to the bus 904 provide memory, illustratively including a random access memory (RAM) 910, hard drive 912, and one or more peripheral memory devices such as a floppy disk drive 914 and compact disk (CD) drive 916. The imager device 908 may be constructed as shown in FIG. 1 with the pixel array 200 having the characteristics of the invention as described above in connection with FIGS. 2-11. The imager device 908 may, in turn, be coupled to processor 902 for image processing, or other image handling operations. Examples of processor based systems, which may employ the imager device 908, include, without limitation, computer systems, camera systems, scanners, machine vision systems, vehicle navigation systems, video telephones, surveillance systems, auto focus systems, star tracker systems, motion detection systems, image stabilization systems, and others.

The devices described above illustrate typical devices of many that could be used. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A method of operating a pixel of an image sensor comprising:
    accumulating a charge in a photosensor associated with the pixel;
    transferring the charge from the photosensor to a storage node via a shutter transistor directly connected between the photosensor and the storage node, wherein the transferring of the charge from the photosensor to the storage node includes switching a gate of the shutter transistor from a closed state to an open state;
    during an integration period, maintaining the gate of the shutter transistor in the open state, maintaining a gate of a transfer gate transistor in a closed state, and resetting a charge at a floating diffusion node, the floating diffusion node being separate from the storage node, the transfer gate transistor directly connected between the storage node and the floating diffusion node, the transfer gate transistor directly connected between the shutter transistor and the floating diffusion node, the transfer gate transistor being configured to selectively transfer charge between the storage node and the floating diffusion node;
    sampling a value of a reset charge at the floating diffusion node;
    transferring the charge from the storage node to the floating diffusion node via the transfer gate transistor, wherein the transferring of the charge from the storage node to the floating diffusion node includes switching the gate of the transfer gate transistor from the closed state to an open state; and
    after transferring the charge to the floating diffusion node, sampling a value of the transferred charge at the floating diffusion node.

2. The method of claim 1, wherein the storage node is formed by a depletion region that is at least partially within a substrate on which the pixel is formed.

3. The method of claim 2, further comprising
    controlling a barrier region with the shutter transistor, the barrier region being coupled to the shutter transistor and located within the substrate between the photosensor and the storage node and being oppositely doped from the storage node.

4. The method of claim 3, wherein the barrier region includes boron.

5. The method of claim 2, wherein the depletion region forming the storage node is completely within the substrate on which the pixel is formed.

6. The method of claim 1, wherein sampling charge from the floating diffusion node further includes outputting a signal produced by a source follower transistor, wherein the source follower transistor receives charge from the floating diffusion node.

7. The method of claim 1, further comprising:
    resetting the storage node, wherein resetting the storage node includes switching the transfer gate transistor from the closed state to the open state and cycling the gate of the shutter transistor while the transfer gate transistor is in the open state.

8. The method of claim 1, wherein resetting the charge at the floating diffusion node includes resetting the charge at the floating diffusion node while simultaneously maintaining the gate of the shutter transistor in the open state.

9. A pixel circuit formed on a substrate comprising:
    a photosensor configured to accumulate charge during an integration period;
    a shutter transistor directly connected between the photosensor and a storage node, and configured to transfer charge from the photosensor to the storage node, based on a gate of the shutter transistor being switched from a closed state to an open state;
    wherein the gate of the shutter transistor is configured to be maintained in the open state during the integration period;
    a transfer gate transistor configured to transfer charge from the storage node to a floating diffusion node at an end of the integration period, wherein
    the storage node is separate from the floating diffusion node,
    the transfer gate transistor is directly connected between the storage node and the floating diffusion node,
    the transfer gate transistor is directly connected between the shutter transistor and the floating diffusion node, and
    the transfer gate transistor is configured to be maintained in a closed state during the integration period; and
    a readout circuit configured to provide a pixel output signal based on charges transferred to the floating diffusion node, the readout circuit including,
    a reset transistor configured to reset a charge on the floating diffusion node during the integration period, and
    a source-follower transistor configured to receive charge from the floating diffusion node both after the charge on the floating diffusion node is reset and after charge is transferred from the storage node to the floating diffusion node.

10. The pixel circuit of claim 9, wherein the readout circuit further includes a row select transistor connected to the source-follower transistor, and the row select transistor is configured to output a signal produced by the source-follower transistor.

11. The pixel circuit of claim 9, wherein the storage node is formed by a depletion region that is at least partially within the substrate.

12. The pixel circuit of claim 11, further comprising:
    a barrier region located within the substrate between the photosensor and the storage node, the barrier region being oppositely doped from the storage node and being coupled to and controlled by the shutter transistor.

13. The pixel circuit of claim 12, wherein the barrier region includes boron.

14. The pixel circuit of claim 9, wherein the storage node is formed within the pixel.

15. The pixel circuit of claim 9, wherein the transfer gate transistor is configured to reset the storage node, and wherein the shutter transistor is configured to reset the photosensor simultaneously with the reset of the storage node.

16. The pixel circuit of claim 9, wherein the shutter transistor remains on during the integration period.

17. An imaging system comprising:
a processor; and
an imaging device including an array of pixels formed on a substrate, coupled to the processor, each pixel including,
a photosensor configured to accumulate charge during an integration period;
a shutter transistor directly connected to the photosensor and configured to transfer charge from the photosensor, based on a gate of the shutter transistor being switched from a closed state to an open state;
wherein the gate of the shutter transistor is configured to be maintained in the open state during the integration period;
a storage node directly connected to the shutter transistor and configured to receive the charge transferred by the shutter transistor;
a transfer gate transistor directly connected to the storage node and configured to transfer charge from the storage node, wherein
the storage node is separate from a floating diffusion node, the transfer gate transistor is between the storage node and the floating diffusion node, the transfer gate transistor is between the shutter transistor and the floating diffusion node, and
the transfer gate transistor is configured to be maintained in a closed state during the integration period;
the floating diffusion node directly connected to the transfer gate transistor and configured to receive the charge from the storage node when the transfer gate is transistor activated at an end of the integration period; and
a readout circuit connected to the floating diffusion node, the readout circuit being configured to output the charge accumulated at the floating diffusion node, wherein the readout circuit includes,
a reset transistor configured to reset a charge on the floating diffusion node during the integration period and
a source-follower transistor configured to receive charge from the floating diffusion node both after the charge on the floating diffusion node is reset and after charge is transferred from the storage node to the floating diffusion node.

18. The system of claim 17, wherein the storage node of each pixel is formed by a depletion region that is at least partially within the substrate.

19. The system of claim 18, wherein each pixel further includes a barrier region located within the substrate between the photosensor and the storage node, the barrier region being opposingly doped from the storage node and being coupled to and controlled by the shutter transistor.

* * * * *